(12) United States Patent
Jeon et al.

(10) Patent No.: US 8,734,670 B2
(45) Date of Patent: May 27, 2014

(54) LEAD-FREE PIEZOELECTRIC MATERIALS WITH ENHANCED FATIGUE RESISTANCE

(75) Inventors: Yu Hong Jeon, Corvallis, OR (US); David Cann, Corvallis, OR (US); Eric Patterson, Corvallis, OR (US); Parkpoom Jarupoom, Corvallis, OR (US); Brady Gibbons, Corvallis, OR (US); Peter Mardilovich, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/819,946

(22) PCT Filed: Sep. 30, 2010

(86) PCT No.: PCT/US2010/050965
§ 371 (c)(1),
(2), (4) Date: Feb. 28, 2013

(87) PCT Pub. No.: WO2012/044313
PCT Pub. Date: Apr. 5, 2012

(65) Prior Publication Data
US 2013/0153812 A1    Jun. 20, 2013

(51) Int. Cl.
*C04B 35/00* (2006.01)

(52) U.S. Cl.
USPC .................................................. 252/62.9 PZ

(58) Field of Classification Search
USPC ....................................... 252/62.9 PZ, 62.9 R
See application file for complete search history.

(56) References Cited

U.S. PATENT DOCUMENTS

| | | |
|---|---|---|
| 2003/0200790 A1 | 10/2003 | Harada et al. |
| 2008/0237530 A1 | 10/2008 | Tsukada et al. |
| 2008/0237531 A1 | 10/2008 | Tsukada et al. |
| 2010/0117565 A1 | 5/2010 | Moloni et al. |
| 2010/0123370 A1 | 5/2010 | Yamaguchi et al. |

FOREIGN PATENT DOCUMENTS

| | | | |
|---|---|---|---|
| CN | 1511800 | | 7/2004 |
| JP | 2002265262 | | 9/2002 |
| JP | 2002265262 A | * | 9/2002 |
| JP | 2002321976 | | 11/2002 |
| JP | 2003201171 | | 7/2003 |
| JP | 2004075449 | | 3/2004 |
| JP | 2004168603 | | 6/2004 |
| KR | 20040054965 | | 6/2004 |
| KR | 20090088991 | | 8/2009 |
| WO | WO-2009079154 | | 6/2009 |
| WO | WO-2010036363 | | 4/2010 |

OTHER PUBLICATIONS

JP2002265262 A machine translation.*
P. Jarupoom et al., "Dielectric and Ferroelectric Properties of (Bi1/2K1/2)TiO3-(Bi1/2Na1/2)TiO3-Bi(B1/2Ti1/2) O3 Lead-free Piezoelectric Ceramics," 19th Int'l. Symposium on the 19th Int'l. Symposium on the Applications of Ferroelectrics, 10th European Conf. on the Applications of Polar Dielectrics, Aug. 9-12, 2010.

(Continued)

*Primary Examiner* — Emily Le
*Assistant Examiner* — Lynne Edmondson

(57) ABSTRACT

A lead-free piezoelectric ceramic material has the general chemical formula $xBi(A_{0.5}Ti_{0.5})O_3$-$y(Bi_{0.5}K_{0.5})TiO_3$-$z(Bi_{0.5}Na_{0.5})TiO_3$, wherein $x+y+z=1$, $x \neq 0$, and A=Ni or Mg.

11 Claims, 6 Drawing Sheets

(56) References Cited

OTHER PUBLICATIONS

Robert Dittmer et al., "Effect of BZT on the Piezoelectric Performance of BNT-BKT Lead-Free Piezoceramics," 19th Int'l. Symposium on the 19th Int'l. Symposium on the Applications of Ferroelectrics, 10th European Conf. on the Applications of Polar Dielectrics, Aug. 9-12, 2010.

Yu Hong Jeon et al., "Dielectric and Piezoelectric Properties of Bi-based Lead Free Thin Films," 19th Int'l. Symposium on the 19th Int'l. Symposium on the Applications of Ferroelectrics, 10th European Conf. on the Applications of Polar Dielectrics, Aug. 9-12, 2010.

\* cited by examiner

LEAD-FREE PIEZOELECTRIC MATERIALS WITH ENHANCED FATIGUE RESISTANCE

BACKGROUND

The present disclosure generally relates to piezoelectric ceramic materials, more particularly to lead-free piezoelectric ceramic materials based on binary and ternary compositions containing bismuth magnesium titanate or bismuth calcium titanate, together with bismuth potassium titanate-bismuth sodium titanate.

Piezoelectric ceramic materials (also referred to as piezoelectric ceramics or piezoceramics) have been widely used in applications such as actuators, transducers, resonators, sensors, and random access memories. Among those piezoelectric ceramics, lead zirconate titanate (PZT), and its related solid solutions are the most widely used due to their excellent piezoelectric properties and the ease with which modifications by doping can be made during manufacturing. However, there are drawbacks to using PZT which limit its desirability in many applications. One concern is its possible environmental effects due to the toxicity of highly volatile PbO which can evolve from PZT during fabrication. Another drawback of PZT piezoceramics is the strong fatigue behavior associated with PZT. Fatigue is a phenomenon in which a piezoelectric material loses its switchable polarization and electromechanical strain during electrical cyclic loading.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
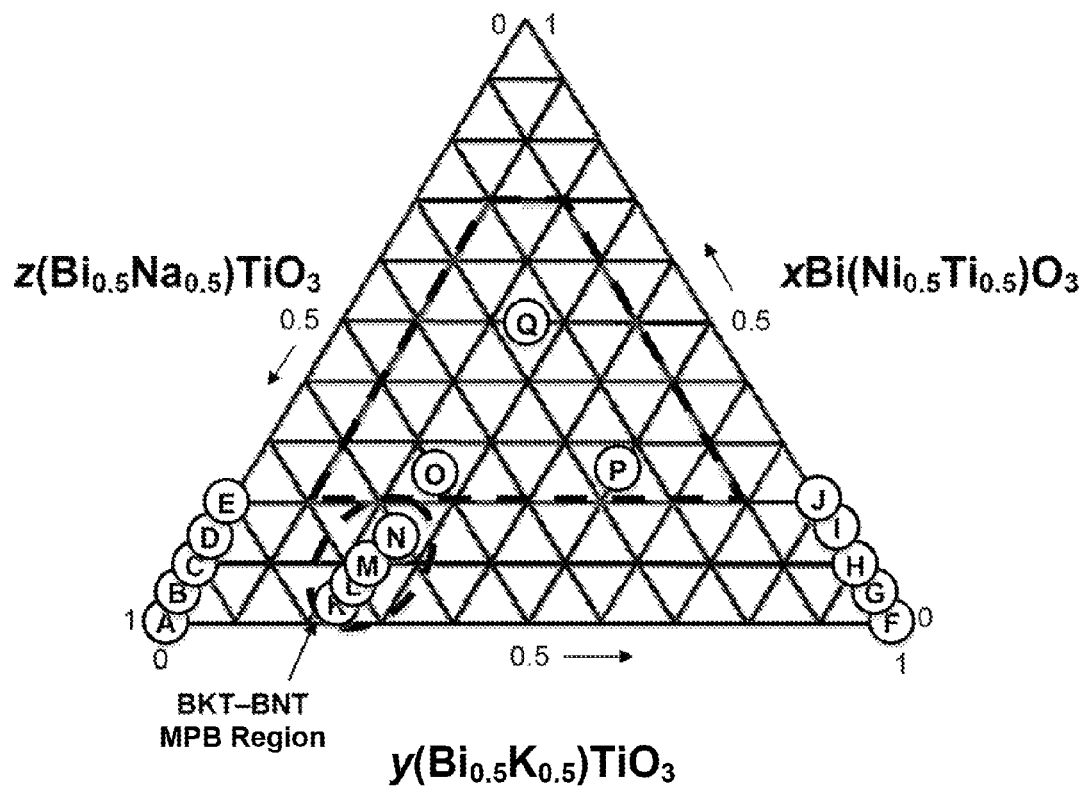
FIG. 1 is a ternary compositional/phase diagram illustrating the compositional range of Ni-based piezoelectric materials according to certain embodiments.

Certain terms are used throughout the following description and claims. In the following description and in the claims, the terms "including" and "comprising" are used in an open-ended fashion, and thus should be interpreted to mean "including, but not limited to . . . ."

The term "Curie temperature" refers to the temperature above which a piezoelectric material loses its spontaneous polarization and piezoelectric characteristics.

The term "polarization hysteresis" refers to lead-free piezoelectric ceramic materials that display non-linear polarization characteristics indicative of a polar state.

The term "electromechanical strain" refers to an electric field induced strain and is commonly expressed in terms of one or more piezoelectric coefficients ($d_{33}$ and $d_{31}$, for example), where $d_{ij}$ (units pm/V) is the tensor property that relates the strain to the applied electric field (V/m). The $d_{33}$ coefficient can be measured in many different ways, such a piezoelectric resonance, the direct piezoelectric effect, the indirect piezoelectric effect, and others. In the context of this disclosure, the $d_{33}$ coefficient is calculated as the ratio between the maximum electromechanical strain and the applied electric field ($d_{33}=S_{max}/E_{max}$). Sometimes this is described as the effective piezoelectric coefficient or the normalized strain or $d_{33}$*. An example of its use is given in Y. Hiruma et al., *J. Appl. Phys.* 103:084121 (2008).

In the context of piezoelectric ceramic materials, the term "fatigue" refers to the observed loss of polarization and electromechanical strain after the application of a cyclic electric field.

The term "polarization remanence" refers to the polarization measured at zero field during a polarization hysteresis measurement. It is a unique characteristic of polar, non-linear dielectrics.

The term "morphotropic region" refers to compositions where multiple perovskite phases co-exist, and "morphotropic phase boundary" refers to a specific composition where two or more perovskite phases co-exist.

The relative amounts or proportions of the components in a lead-free piezoelectric material are expressed in terms of mole fraction or mole percent (mol %), as for example, $0.01 \leq x \leq 0.1$, $0.3 \leq y \leq 0.5$, and $0.4 \leq z \leq 0.6$, or 10BMgT-30BKT-60BNT.

The term "about" when referring to a numerical value or range is intended to include larger or smaller values resulting from experimental error that can occur when taking measurements. Such measurement deviations are usually within plus or minus 10 percent of the stated numerical value.

Temperature, ratios, concentrations, amounts, and other numerical data may be presented herein in a range format. It is to be understood that such range format is used merely for convenience and brevity, and should be interpreted flexibly to include not only the numerical values explicitly recited as the limits of the range, but also to include all the individual numerical values or sub-ranges encompassed within that range as if each numerical value and sub-range is explicitly recited. For example, a temperature range of about 100° C. to about 500° C. should be interpreted to include not only the explicitly recited limits of 100° C. and 500° C., but also to include every intervening temperature such as 250° C., 300° C., 350° C. and 400° C., and all sub-ranges such as 300° C. to 400° C., and so forth.

DETAILED DESCRIPTION

The following discussion is directed to various embodiments of the invention. The embodiments disclosed should not be interpreted, or otherwise used, as limiting the scope of the disclosure, including the claims. In addition, one skilled in the art will understand that the following description has broad application, and the discussion of any embodiment is meant only to be an example of that embodiment, and not intended to intimate that the scope of the disclosure, including the claims, is limited to that embodiment.

Lead-Free Nickel-Based Piezoelectric Ceramics

Referring to FIG. 1, a ternary composition/phase diagram illustrates the entire range of lead-free piezoelectric ceramic materials based on the binary systems $Bi(Ni_{0.5}Ti_{0.5})O_3$—$(Bi_{0.5}K_{0.5})TiO_3$ and $Bi(Ni_{0.5}Ti_{0.5})O_3$—$(Bi_{0.5}Na_{0.5})TiO_3$ and on ternary compositions in the $Bi(Ni_{0.5}Ti_{0.5})O_3$—$(Bi_{0.5}K_{0.5})TiO_3$—$(Bi_{0.5}Na_{0.5})TiO_3$ system. These binary and ternary systems are sometimes referred to herein as BNiT-BKT, BNiT-BNT, and BNiT-BKT-BNT, respectively, or are referred to as simply Ni-based binary and ternary compositions. Two regions containing respective binary compositions BNiT-BNT and BNiT-BKT, wherein Ni ranges from about 1 mol % to about 5 mol %, consist of single-phase perovskite with large piezoelectric coefficients. Exemplary compositions B-E (defined in Table 1) are in the first region, and exemplary compositions G-J are in the second region. In Table 1 and FIG. 1, the unary perovskite compositions BNT (composition A) and BKT (composition F) are included for comparison purposes only. A third region shown in FIG. 1 is in the vicinity of MPB at 80 mol % BNT-20 mol % BKT. It was discovered that with the addition of up to 20 mol % BNiT to the MPB composition, a single phase perovskite with high piezoelectric coefficients is obtained. Representative compositions K-N are included in this single phase perovskite region adjacent to the BNT-BKT MPB (indicated by a dashed oval).

Also shown in FIG. 1 is a central region (indicated by a dashed trapezoid), including a group of ternary stoichiometries that are also single-phase perovskites with excellent piezoelectric coefficients. Representative compositions O-Q are included in this region and are also identified in Table 1. The stoichiometries of some representative BNiT-BKT, BNiT-BNT and BNiT-BKT-BNT materials with single phase stable perovskite structures shown in FIG. 1 are also identified in Table 1.

TABLE 1

| Identifier | $Bi(Ni_{0.5}Ti_{0.5})O_3$ (Mol %) | $(Bi_{0.5}K_{0.5})TiO_3$ (Mol %) | $(Bi_{0.5}Na_{0.5})TiO_3$ (Mol %) |
|---|---|---|---|
| A | 0 | 0 | 100 |
| B | 5 | 0 | 95 |
| C | 10 | 0 | 90 |
| D | 15 | 0 | 85 |
| E | 20 | 0 | 80 |
| F | 0 | 100 | 0 |
| G | 5 | 95 | 0 |
| H | 10 | 90 | 0 |
| I | 15 | 85 | 0 |
| J | 20 | 80 | 0 |
| K | 5 | 20 | 75 |
| L | 7.5 | 22.5 | 70 |
| M | 10 | 25 | 65 |
| N | 15 | 25 | 60 |
| O | 25 | 25 | 50 |
| P | 25 | 50 | 25 |
| Q | 50 | 25 | 25 |

The regions shown in FIG. 1 that are roughly defined by BNiT concentrations greater than 20 mole percent, and greater than 10 mole percent of BKT and BNT contain stable single phase perovskites with high strain values. In many cases, this material has a maximum electromechanical strain coefficient ($d_{33}$) in the range of about 200 pm/V to about 700 pm/V. In some embodiments, a BNiT-BNT, BNiT-BKT or BNiT-BNT-BKT composition has a $d_{33}$ coefficient in the range of about 400 pm/V to about 650 pm/V. The representative compositions identified as B-E and G-Q in Table 1 and FIG. 1 demonstrated the highest strain values of the Ni-based stable single phase perovskites tested. The electromechanical strain behavior of this material shows large strain values (in the range of 0.20% to about 0.35%) and large strain hysteresis (loss). While BNiT is not stable in it's pure state, it exhibits a remarkably large range of solubility with BNT and BKT. The binary compositions exhibit approximately 20 mole percent solid solubility. However, for the ternary compositions the solubility is greater than 50 mole percent. Without being limited to any particular theory, it is thought that this surprisingly large solubility of BNiT in the ternary compositions may be due, in part, to complex interactions between the B-cations in the octahedral network in the perovskite structure. In some embodiments, a lead-free piezoelectric ceramic material has one of the following general chemical formulas:

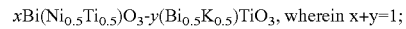
$xBi(Ni_{0.5}Ti_{0.5})O_3$-$y(Bi_{0.5}K_{0.5})TiO_3$, wherein x+y=1;

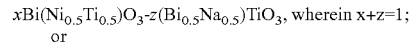
$xBi(Ni_{0.5}Ti_{0.5})O_3$-$z(Bi_{0.5}Na_{0.5})TiO_3$, wherein x+z=1;
or

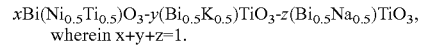
$xBi(Ni_{0.5}Ti_{0.5})O_3$-$y(Bi_{0.5}K_{0.5})TiO_3$-$z(Bi_{0.5}Na_{0.5})TiO_3$, wherein x+y+z=1.

None of x, y, z equals zero. These formulas encompass all binary and ternary Ni-containing compositions in FIG. 1. In some embodiments, 0.01≤x≤0.70. This ternary compositional region represents the primary range of stability for the perovskite phase.

In some embodiments, a lead-free piezoelectric ceramic material has the general chemical formula $xBi(Ni_{0.5}Ti_{0.5})O_3$-$y(Bi_{0.5}K_{0.5})TiO_3$ or $xBi(Ni_{0.5}Ti_{0.5})O_3$-$y(Bi_{0.5}Na_{0.5})TiO_3$, wherein x+y=1 and 0<x≤0.50. These compositions represent the basic range of stability of the binary compositions with a stable perovskite phase.

In some embodiments, a lead-free piezoelectric ceramic material has the general chemical formula $xBi(Ni_{0.5}Ti_{0.5})O_3$-$y(Bi_{0.5}K_{0.5})TiO_3$-$z(Bi_{0.5}Na_{0.5})TiO_3$, wherein x+y+z=1 and 0.01≤x≤0.99. This encompasses substantially all possible ternary compositions in FIG. 1, some of which include a stable perovskite phase.

The Curie temperature ($T_a$) of most Ni-based binary and ternary compositions is in the range of about 100° C. to about 500° C. In some cases the $T_c$ of a composition is between about 300° C. and about 400° C. The relative proportions of the components of the Ni-based binary and ternary compositions may be varied during production of the ternary composition so that the product will have a specified Curie temperature range. Depending upon the desired end use of the composition, the operating temperature of the ceramic product may differ from the Tc of the Ni-based binary or ternary composition. For example, in some situations the operating temperature will be about 100° C.-150° C. lower than the $T_c$. As a practical matter, maximum operating temperature of a Ni-based binary or ternary composition ceramic product is its depolarization temperature.

Polarization hysteresis data for representative compositions indicate ferroelectric behavior, and a plot of the electric field induced strain appears as butterfly loops, consistent with other ferroelectric materials. Many of these Ni-based binary and ternary compositions demonstrate or are predicted to have properties similar to or exceeding those of PZT.

Properties of the BNiT-BNT, BNiT-BKT or BNiT-BNT-BKT composition materials may be evaluated by piezoelectric resonance measurements following the customary IEEE standard, poling studies to measure the low-field electromechanical strain coefficient $d_{33}$, fatigue measurements, and studies of the temperature dependence of these piezoelectric properties. Polarization hysteresis data for representative compositions indicate ferroelectric behavior and the electric field induced strain appears as the expected butterfly loops. Excellent fatigue resistance is predicted for many of the BNiT-BNT, BNiT-BKT and BNiT-BNT-BKT piezoelectric ceramics, with losses of ≤1 percent of the maximum polarization after 1 million cycles in some cases. This compares quite favorably to the fatigue behavior of conventional PZT materials. The piezoelectric strain coefficients ($d_{33}$ and $d_{31}$) of the Ni-based binary and ternary compositions are generally below those of PZT. By way of comparison, conventional PZT piezoelectric ceramics typically demonstrate the following properties of piezoelectric resonance, low-field $d_{33}$, fatigue and temperature dependence of piezoelectric properties: $\in_r$ about 1000-3400; $d_{33}$ about 200 pm/V-600 pm/V; $k_{33}$ about 0.64-0.75; and $T_c$ about 195° C.-365° C.

In some embodiments, a disclosed Ni-based binary and ternary piezoelectric ceramic material demonstrates a piezoelectric strain coefficient ($d_{33}$) equal to or exceeding that of a lead zirconate titanate perovskite (PZT). In some embodiments, the ceramic material demonstrates a maximum electromechanical strain value of about 0.30 percent elongation under electric field.

In some embodiments, a disclosed lead-free piezoelectric ceramic material demonstrates fatigue resistance exceeding that of a lead zirconate titanate perovskite. In some embodiments, a Ni-based binary or ternary piezoelectric ceramic material demonstrates a maximum high-field piezoelectric $d_{33}$ value in the range of about 200 pm/V to about 700 pm/V, and in some cases is in the range of about 400 pm/V to about 650 pm/V.

Lead-Free Magnesium-based Piezoelectric Ceramics.

Figure 6:
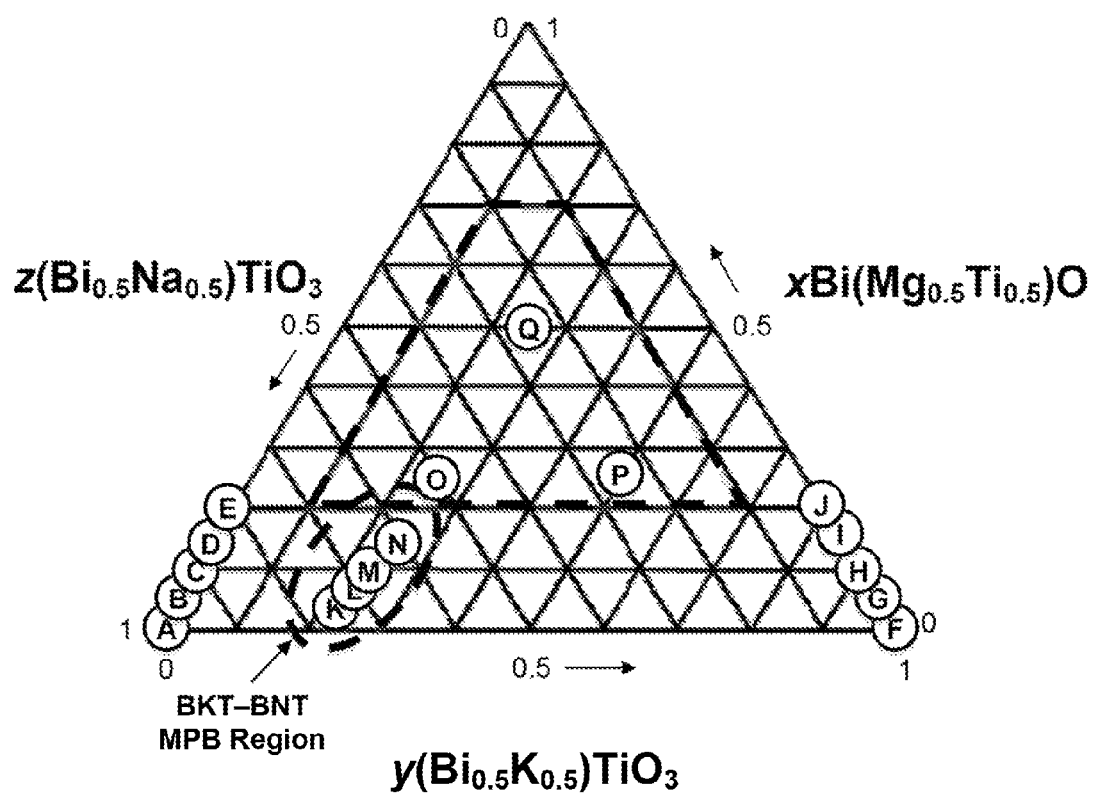
FIG. 6 is a ternary compositional/phase diagram illustrating the compositional range of Mg-based piezoelectric materials according to certain embodiments.

Referring to FIG. 6, a ternary composition/phase diagram illustrates the entire range of lead-free piezoelectric ceramic materials based on the binary systems $Bi(Mg_{0.5}Ti_{0.5})O_3$—$(Bi_{0.5}K_{0.5})TiO_3$ and $Bi(Mg_{0.5}Ti_{0.5})O_3$—$(Bi_{0.5}Na_{0.5})TiO_3$ and on ternary compositions in the $Bi(Mg_{0.5}Ti_{0.5})O_3$—$(Bi_{0.5}K_{0.5})TiO_3$—$(Bi_{0.5}Na_{0.5})TiO_3$ system. The binary systems are sometimes referred to herein as BMgT-BNT or BMgT-BKT. The ternary systems are sometimes referred to herein as BMgT-BNT-BKT. For simplicity, these binary and ternary systems are sometimes referred to as Mg-based binary and ternary compositions. Similar to the above-described Ni-based compositions, there are two regions containing exemplary binary compositions BMgT-BNT and BMgT-BKT, respectively, wherein Mg ranges from about 1 mol % to about 5 mol %, consist of single-phase perovskite with large piezoelectric coefficients. Exemplary compositions B-E (defined in Table 2) are in the first region, and exemplary compositions G-J are in the second region. In Table 2 and FIG. 6, the unary perovskite compositions BNT (composition A) and BKT (composition F) are included for comparison purposes only. A third region shown in FIG. 6 is in the vicinity of MPB at 80 mol % BNT-20 mol % BKT. It was discovered that with the addition of up to 20 mol % BMgT to the MPB composition, a single phase perovskite with high piezoelectric coefficient is obtained. Representative compositions K-N are included in this single phase perovskite region adjacent to the BNT-BKT MPB (indicated by a dashed oval).

Also shown in FIG. 6 is a central region (dashed trapezoid) including a group of ternary stoichiometries that are also single-phase perovskites with excellent piezoelectric coefficients. Representative compositions O-Q are included in this region and are also identified in Table 2. The stoichiometries of some representative BMgT-BKT, BMgT-BNT, and BMgT-BKT-BNT materials with single phase stable perovskite structures shown in FIG. 6 are also identified in Table 2.

TABLE 2

| Identifier | $Bi(Mg_{0.5}Ti_{0.5})O_3$ (Mol %) | $(Bi_{0.5}K_{0.5})TiO_3$ (Mol %) | $(Bi_{0.5}Na_{0.5})TiO_3$ (Mol %) |
|---|---|---|---|
| A | 0 | 0 | 100 |
| B | 5 | 0 | 95 |
| C | 10 | 0 | 90 |
| D | 15 | 0 | 85 |
| E | 20 | 0 | 80 |
| F | 0 | 100 | 0 |
| G | 5 | 95 | 0 |
| H | 10 | 90 | 0 |
| I | 15 | 85 | 0 |
| J | 20 | 80 | 0 |
| K | 5 | 22.5 | 72.5 |
| L | 7.5 | 22.5 | 70 |
| M | 10 | 25 | 65 |
| N | 15 | 25 | 60 |
| O | 25 | 25 | 50 |
| P | 25 | 50 | 25 |
| Q | 50 | 25 | 25 |

The regions shown in FIG. 6 that are roughly defined by BMgT concentrations greater than 20 mole percent, and greater than 10 mole percent of BKT and BNT contain stable single phase perovskites with high strain values. In many cases, this material has a maximum electromechanical strain coefficient ($d_{33}$) in the range of about 200 pm/V to about 700 pm/V. In some embodiments, a BMgT-BNT, BMgT-BKT or BMgT-BNT-BKT composition has a $d_{33}$ coefficient in the range of about 400 pm/V to about 650 pm/V. The representative compositions identified as B-E and G-Q in Table 2 and FIG. 6 demonstrated the highest strain values of the Mg-based stable single phase perovskites tested. The electromechanical strain behavior of this material shows large strain values (in the range of 0.20% to about 0.35%) and large strain hysteresis (loss). While BMgT is not stable in it's pure state, like BNiT, it exhibits a remarkably large range of solubility with BNT and BKT. The Mg-based binary compositions exhibit approximately 20 mole percent solid solubility. However, for the ternary compositions the solubility is greater than 50 mole percent. Without being limited to any particular theory, it is thought that this surprisingly large solubility of BMgT in the ternary compositions may be due, in part, to complex interactions between the B-cations in the octahedral network in the perovskite structure.

In some embodiments, a lead-free piezoelectric ceramic material has one of the following general chemical formulas:

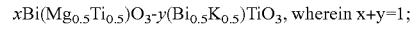

$xBi(Mg_{0.5}Ti_{0.5})O_3$-$y(Bi_{0.5}K_{0.5})TiO_3$, wherein x+y=1;

$$x\text{Bi}(\text{Mg}_{0.5}\text{Ti}_{0.5})\text{O}_3\text{-}z(\text{Bi}_{0.5}\text{Na}_{0.5})\text{TiO}_3,\text{ wherein }x+z=1;$$

or $$x\text{Bi}(\text{Mg}_{0.5}\text{Ti}_{0.5})\text{O}_3\text{-}y(\text{Bi}_{0.5}\text{K}_{0.5})\text{TiO}_3\text{-}z(\text{Bi}_{0.5}\text{Na}_{0.5})\text{TiO}_3,\text{ wherein }x+y+z=1.$$

None of x, y, z equals zero. These formulas encompass all binary and ternary Mg-containing compositions in FIG. 6. In some embodiments, $0.01 \le x \le 0.70$. This ternary compositional region represents the primary range of stability for the perovskite phase.

In some embodiments, a lead-free piezoelectric ceramic material has the general chemical formula $x\text{Bi}(\text{Mg}_{0.5}\text{Ti}_{0.5})\text{O}_3\text{-}y(\text{Bi}_{0.5}\text{K}_{0.5})\text{TiO}_3$ or $x\text{Bi}(\text{Mg}_{0.5}\text{Ti}_{0.5})\text{O}_3\text{-}y(\text{Bi}_{0.5}\text{Na}_{0.5})\text{TiO}_3$, wherein $x+y=1$, and $0<x\le 0.50$. These compositions represent the basic range of stability of the binary compositions with a stable perovskite phase.

In some embodiments, a lead-free piezoelectric ceramic material has the general chemical formula $x\text{Bi}(\text{Mg}_{0.5}\text{Ti}_{0.5})\text{O}_3\text{-}y(\text{Bi}_{0.5}\text{K}_{0.5})\text{TiO}_3\text{-}z(\text{Bi}_{0.5}\text{Na}_{0.5})\text{TiO}_3$, wherein $x+y+z=1$ and $0.01 \le x \le 0.99$. This encompasses substantially all possible ternary compositions in FIG. 6, some of which include a stable perovskite phase.

The Curie temperature ($T_c$) of most Mg-based binary and ternary compositions is in the range of about 100° C. and 500° C. In some cases the $T_c$ of a composition is between about 300° C. and about 400° C. The relative proportions of the components of the Mg-based binary and ternary compositions may be varied during production of the ternary composition so that the product will have a specified Curie temperature range. Depending upon the desired end use of the composition, the operating temperature of the ceramic product may differ from the Tc of the Mg-based binary or ternary composition. For example, in some situations the operating temperature will be about 100° C.-150° C. lower than the $T_c$. s a practical matter, maximum operating temperature of a Mg-based binary or ternary composition ceramic product is its depolarization temperature.

Polarization hysteresis data for representative compositions indicate ferroelectric behavior, and a plot of the electric field induced strain appears as butterfly loops, consistent with other ferroelectric materials. Many of these Mg-based binary and ternary compositions demonstrate or are predicted to have properties similar to or exceeding those of PZT.

Properties of the BMgT-BNT, BMgT-BKT or BMgT-BNT-BKT composition materials may be evaluated by piezoelectric resonance measurements following the customary IEEE standard, poling studies to measure the low-field electromechanical strain coefficient $d_{33}$, fatigue measurements, and studies of the temperature dependence of these piezoelectric properties. Polarization hysteresis data for representative compositions indicate ferroelectric behavior and the electric field induced strain appears as the expected butterfly loops. Excellent fatigue resistance is predicted for many of the BMgT-BNT, BMgT-BKT and BMgT-BNT-BKT piezoelectric ceramics, with losses of ≤1 percent of the maximum polarization after 1 million cycles in some cases. This compares quite favorably to the fatigue behavior of conventional PZT materials. The piezoelectric strain coefficients ($d_{33}$ and $d_{31}$) of the Mg-based binary and ternary compositions are generally below those of PZT. In some embodiments, a disclosed Mg-based binary and ternary piezoelectric ceramic material demonstrates a piezoelectric strain coefficient ($d_{33}$) equal to or exceeding that of a lead zirconate titanate perovskite (PZT). In some embodiments, the Mg-based binary and ternary piezoelectric ceramic material demonstrates a maximum electromechanical strain value of about 0.30 percent elongation under electric field.

In some embodiments, a disclosed lead-free piezoelectric ceramic material demonstrates fatigue resistance exceeding that of a lead zirconate titanate perovskite. In some embodiments, a Mg-based binary or ternary piezoelectric ceramic material demonstrates a maximum high-field piezoelectric $d_{33}$ value in the range of about 200 pm/V to about 700 pm/V, and in some cases is in the range of about 400 pm/V to about 650 pm/V.

Uses for Lead-Free Piezoelectric Ceramics.

For many applications in which fatigue resistance of a piezoelectric ceramic is more important than the piezoelectric maximum strain performance, a disclosed Ni- or Mg-based binary and ternary ceramic material may be advantageous. It is predicted that many of the Ni- and Mg-based binary and ternary compositions will meet or exceed the piezoelectric properties of doped PZT materials, and will provide a constant strain with minimal or no degradation over the life of a device employing such material. Many Ni-, and Mg-based binary and ternary ceramic materials with improved piezoelectric properties are predicted to be substantially equivalent or superior to conventional PZT-based piezoelectric ceramics and are predicted to have similar potential uses, including but not limited to actuators, transducers, resonators, sensors, and random access memories. Some of these applications will further benefit from the absence of lead in the piezoelectric ceramics.

Production of Lead-Free Piezoelectric Ceramics

A. Ceramic Discs.

All lead-free Ni- and Mg-based binary and ternary ceramic materials described herein may be produced by any suitable solid-state synthesis method, using $\text{Bi}_2\text{O}_3$, $\text{NaCO}_3$, $\text{KCO}_3$ and $\text{TiO}_2$ starting powders, and either NiO or MgO starting powders. The starting powders are preferably at least 99% purity. The Curie temperature ($T_c$) of the resulting product is generally between about 100° C. and about 500° C. The $T_c$ of a piezoelectric ceramic may be increased or decreased by varying the relative amounts of the starting powders. The relative amounts of BNiT/BMgT, BNT and BKT may be adjusted so that the product will have a $T_c$ in a specified range. In accordance with conventional solid state synthesis methods for making ceramic materials, the powders are milled, shaped and calcined to produce the desired ceramic product. Milling can be either wet or dry type milling, as is known in the art. High energy vibratory milling may be used, for instance, to mix starting powders and for post-calcination grinding. The powders are mixed with a suitable liquid (e.g., ethanol or water, or a combination of liquids) and wet milled with a suitable high density milling media (e.g., yttria stabilized zirconia (YSZ) beads). The milled powders are calcined, then mixed with a binder, formed into the desired shape (e.g., pellets) and sintered to produce a ceramic product with high sintered density. For testing purposes, prior to electrical measurements the ceramic disc may be polished to a suitable thickness (e.g., 0.9 mm), and a silver paste (e.g., Heraeus C1000) is applied to both sides of the discs. Depending upon the intended end use, a high-density ceramic disc or pellet containing Ni- or Mg-based binary or ternary material may be polished to a thickness in the range of about 0.5 μm to about 1 μm, suitable for use as a piezoelectric actuator, for example.

B. Ceramic Thin Films.

When the intended use of the Ni- or Mg-based binary or ternary ceramic material requires a thin film product, the production method may be modified to include chemical solution deposition using chemical precursors such bismuth nitrate, titanium isopropoxide, etc., or sputtering using solid state sintered or hot-pressed ceramic targets. Any suitable sputtering or chemical deposition method may be used for C. Piezoelectric Composites.

For end uses such as sensors or transducers, which require the use piezoelectric composites, the above-described sintered Ni- or Mg-based binary or ternary ceramic material can be modified for this purpose. The ceramic powder is ground or milled to the desired particle size and loaded into polymer matrix to create a 0-3 piezoelectric composite. The ceramic powder can be formed into sintered rods or fibers using injection molding or similar technique and loaded into a polymer matrix to create a 1-3 piezoelectric composite. The polymer may be piezoelectric, such as PVDF, or non-piezoelectric such as epoxy depending on the final application.

EXAMPLES

Example 1

Production of Ni-Containing Binary and Ternary Compositions

Lead-free binary or ternary compositions were produced via solid-state synthesis methods, using either NiO or MgO, $Bi_2O_3$ and $TiO_2$, and either or both $NaCO_3$ and $KCO_3$ starting powders of at least 99% purity. Appropriate amounts of those powders were combined to yield BNiT-BKT, BNiT-BNT or BNiT-BKT-BNT. In one case, the resulting composition had the relative proportions (mole percent) $5Bi(Ni_{1/2}Ti_{1/2})O_3$-$72.5(Bi_{1/2}Na_{1/2})TiO_3$-$22.5(Bi_{1/2}K_{1/2})TiO_3$. Six hours of high energy vibratory milling was used for mixing starting powders and for post-calcination grinding. Ethanol mixtures containing 15 vol. % powder were milled with high density YSZ beads approximately ⅜ inch in diameter. After removal of YSZ, calcination was performed on the milled powder in covered crucibles at 900° C. for 6 hours. The calcined powders were mixed with a 3 wt. % solution of Polyvinyl Butyral (PVB) binder, and the powders were uniaxially cold pressed into 12.7 mm pellets at a pressure of 150 MPa. Following a 400° C. binder burnout, the pellets were sintered in covered crucibles at 1100° C. for 2 hours. Prior to electrical measurements, the ceramics discs were polished to thickness of 0.9 mm with smooth and parallel surfaces. Silver paste (Heraeus C1000) was fired on both sides in air at 650° C. for 30 minutes.

Example 2

Measurement of Piezoelectric and Electric-Field Induced Strain Properties of Ni-Containing Binary and Ternary Compositions Ni-containing compositions prepared as described in Example 1 were subjected to x-ray diffraction analysis which confirmed that the material consisted of a single-phase perovskite structure. The resulting x-ray diffraction pattern showed no evidence of any secondary phases in these compositions or any of the compositions listed in Tables I and 3.

Figure 2:
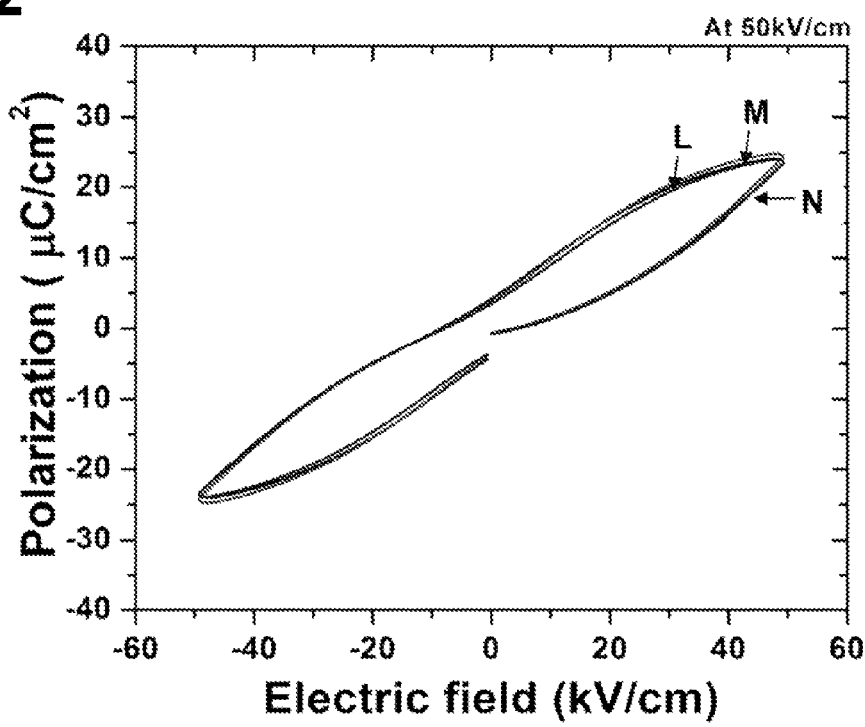
FIG. 2 is a graph of polarization values at applied electrical field of 50 kV/cm of three BNiT-BKT-BNT compositions according to embodiments of the disclosed compositions.
Figure 3:
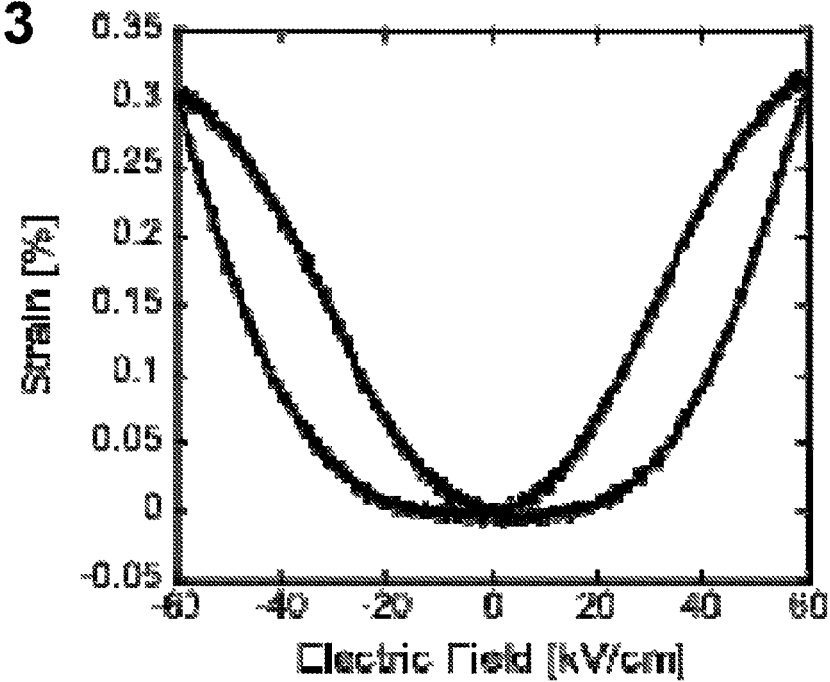
FIG. 3 is a graph showing electromechanical strain values at applied electrical field of 60 kV/cm of a BNiT-BKT-BNT composition according to an embodiment of the disclosed compositions.

FIG. 2 shows polarization values at an applied electrical field of 50 kV/cm of three BNiT-BKT-BNT compositions (compositions L, M, and N) having the relative proportions shown in Table 3 and FIG. 2. The polarization was measured using a Radiant Premier II Ferroelectric Test System which utilizes a Sawyer-Tower circuit. As shown in FIG. 3, the electromechanical strain of a specimen of composition K was measured at an applied electrical field of 60 kV/cm using an optical interferometer directly integrated with the Radiant instrument. Direct measurement of coefficient $d_{33}$ of a ceramic material may also be performed by dual-beam laser interferometer. The results shown in FIGS. 2 and 3 and in Table 3 demonstrate large electromechanical strains with an approximate $d_{33}^*$ value as high as 540 pm/V.

TABLE 3

Electric Field Induced Strain (Ni-containing Compositions)

| Composition (BNiT-BKT-BNT) (mol %) | Composition | Maximum Strain (%) | Electric Field (kV/cm) | $d_{33}^*$ (pm/V) |
|---|---|---|---|---|
| 5-20-75 | K | 0.32 | 60 | 540 |
| 7.5-22.5-70 | L | 0.28 | 60 | 480 |
| 10-25-65 | M | 0.22 | 60 | 370 |

Figure 4:
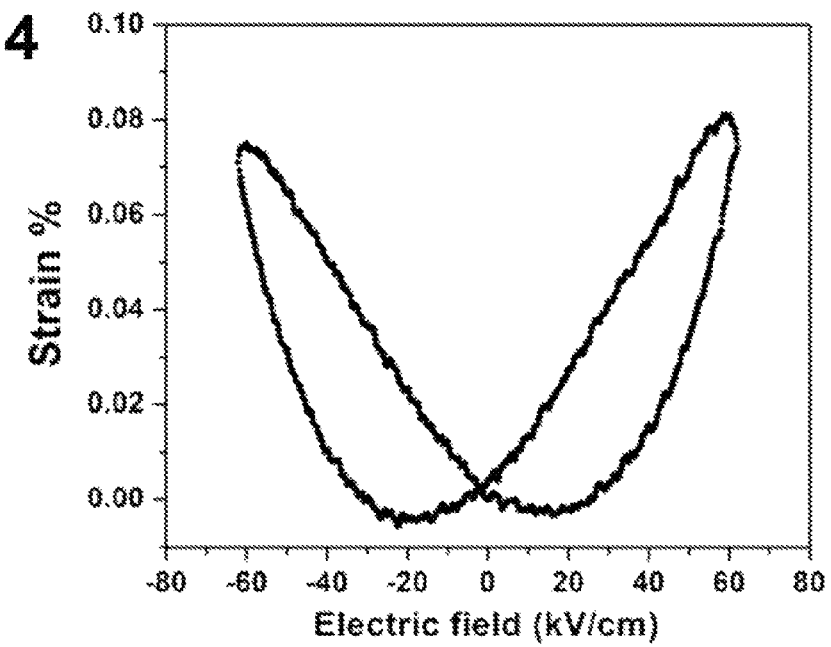
FIG. 4 is a graph of electromechanical strain values at applied electrical fields ranging from −60 kV/cm to 60 kV/cm of a 10 mol % BNiT-90 mol % BNT composition according to an embodiment of the disclosed compositions.

Referring now to FIG. 4, electromechanical strain values of a 10BNiT-90BNT composition were measured at applied electrical fields ranging from −60 kV/cm to 60 kV/cm, and the results show large electromechanical strains of as much as 0.08%. The measured values for these and other representative binary and ternary Ni-based ceramics are comparable to many known Pb-free compositions ($d_{33}$ about 300 pm/V to about 400 pm/V), and are comparable to doped PZT ceramics ($d_{33}$ about 400 pm/V to about 600 pm/V). It is predicted that the depolarization temperature of the $5Bi(Ni_{0.5}Ti_{0.5})O_3$-$22.5(Bi_{0.5}K_{0.5})TiO_3$-$72.5(Bi_{0.5}Na_{0.5})TiO_3$ ceramic, and that of other representative BNiT-BKT-BNT ceramics, is 200° C. or higher, or at least equal to doped PZT materials.

Figure 5:
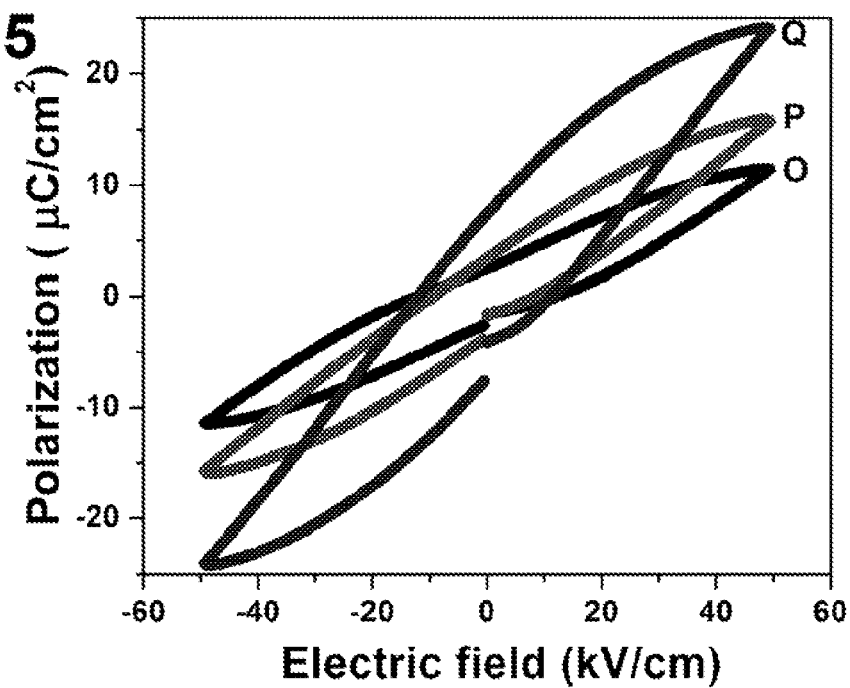
FIG. 5 is a graph of polarization values at applied electrical fields ranging from −60 kV/cm to 60 kV/cm of three BNiT-BKT-BNT compositions according to embodiments of the disclosed compositions.

Three Ni-based ternary ceramic compositions corresponding to "O", "P" and "Q", in Table 1 and FIG. 1 were prepared as described in Example 1, to produce a single phase perovskite structure in each case. These compositions were subjected to x-ray diffraction analysis which confirmed that the material consisted of a single-phase perovskite structure, without any evidence of secondary phases. Their polarization values at applied electrical fields ranging from −60 kV/cm to 60 kV/cm were measured as described in Example 2. The results shown in FIG. 5 indicate that these compositions exhibit a significant degree of hysteresis in the dielectric response.

Example 3

Production of Mg-containing Binary and Ternary Compositions

Lead-free binary or ternary Mg-containing compositions were produced via solid-state synthesis methods, using $Bi_2O_3$, MgO and $TiO_2$, and either or both $NaCO_3$ and $KCO_3$ starting powders of at least 99% purity. Appropriate amounts of those powders were combined to yield BMgT-BKT, BMgT-BNT or BMgT-BKT-BNT compositions. The ceramic materials were formed from these compositions substantially as described in Example 1, above.

Example 4

Measurement of Piezoelectric and Electric-Field Induced Strain Properties of Mg-based Ceramic Materials Mg-containing compositions prepared as described in Example 3 were subjected to x-ray diffraction analysis which confirmed that the material consisted of a single-phase perovskite structure. The resulting x-ray diffraction pattern showed no evidence of any secondary phases in these compositions or any of the compositions listed in Tables 2 and 4.

Figure 7:
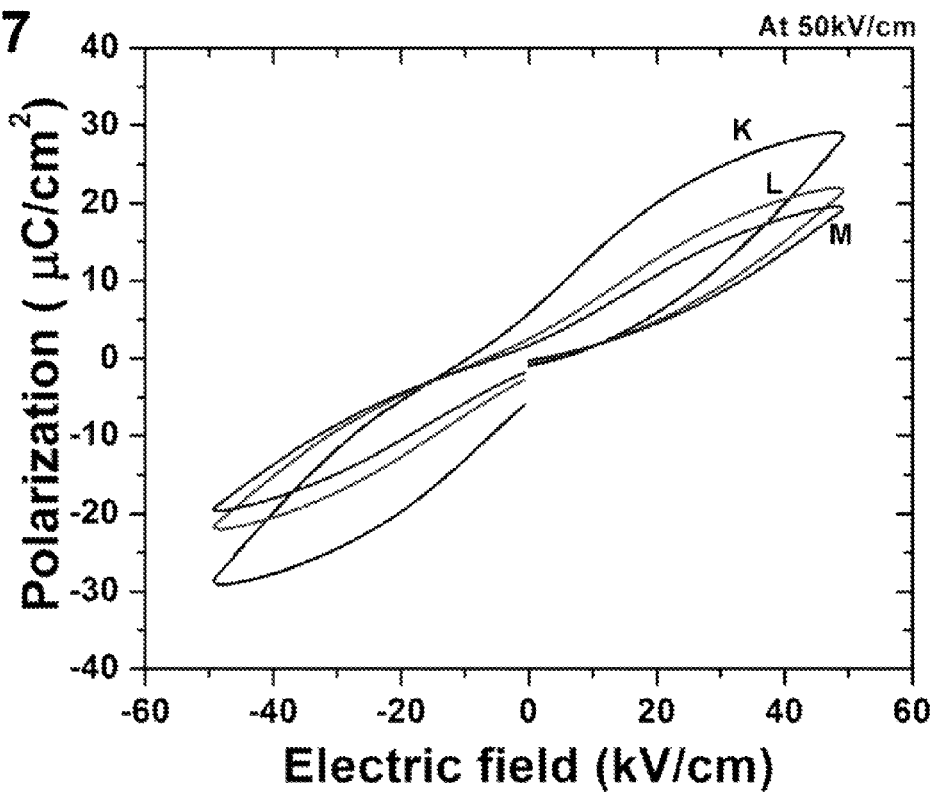
FIG. 7 is a graph of polarization values at an applied electrical field of 50 kV/cm of three BMgT-BKT-BNT compositions according to embodiments of the disclosed compositions.

FIG. 7 shows polarization values at an applied electrical field of 50 kV/cm of three BMgT-BKT-BNT compositions having the relative proportions shown in Table 4 and FIG. 7. Polarization was measured as described above with respect to these Ni-containing piezoelectric compositions (FIG. 7). The electromechanical strain was measured at applied electric fields ranging from −60 kV/cm to 60 kV/cm using an optical interferometer directly integrated with the Radiant instrument. Direct measurement of coefficient $d_{33}$ of a ceramic material may also be performed by dual-beam laser interferometer. These results show large electromechanical strains of representative binary and ternary Mg-based piezoelectric materials with an approximate $d_{33}^*$ value as high as 540 pm/V.

Mg-containing ternary compositions having the relative proportions (mol %) shown in Table 4 were prepared as described in Example 3 and their polarization and electromechanical strain values were measured at applied electrical fields ranging from −60 kV/cm to 60 kV/cm, as described in Example 2.

TABLE 4

Electric Field Induced Strain (Mg-containing Compositions)

| BMgT-BKT-BNT Composition (mol %) | Composition | Max. Strain (%) | Electric Field (max) | $d_{33}^*$ (pm/V) |
|---|---|---|---|---|
| 5-22.5-72.5 | K | 0.32 | 60 kV/cm | 530 |
| 7.5-22.5-70 | L | 0.28 | 60 kV/cm | 480 |
| 10-25-65 | M | 0.23 | 60 kV/cm | 380 |

Figure 8:
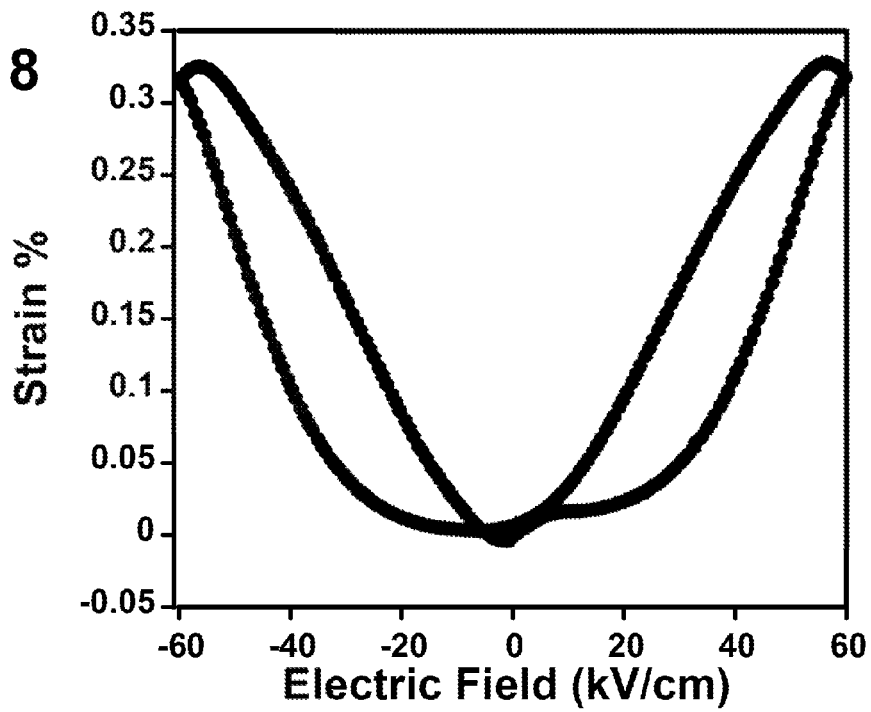
FIG. 8 is a graph showing electromechanical strain values over electrical fields ranging from −60 kV/cm to 60 kV/cm of a BMgT-BNT composition according to an embodiment of the disclosed compositions.
Figure 9:
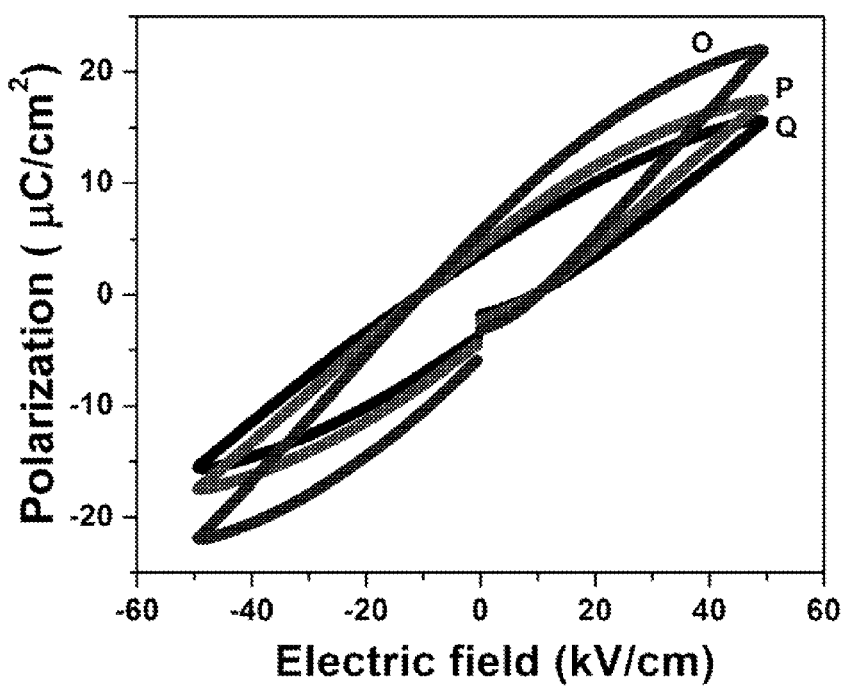
FIG. 9 is a graph of polarization values at applied electrical fields ranging from −60 kV/cm to 60 kV/cm of three BMgT-BKT-BNT compositions according to embodiments of the disclosed compositions.
Figure 10:
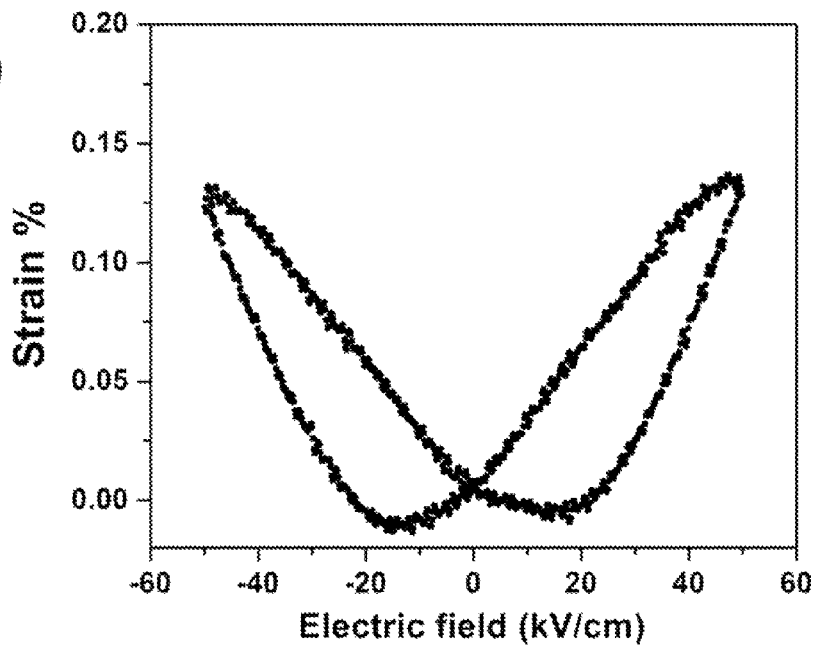
FIG. 10 is a graph showing electromechanical strain values at an applied electrical fields of −60 kV/cm to 60 kV/cm of a BMgT-BKT-BNT composition according to an embodiment of the disclosed compositions.

FIG. 8 shows electromechanical strain values at applied electrical fields ranging from −60 kV/cm to 60 kV/cm of a BMgT-BKT-BNT composition indicated by K on Table 2. FIG. 9 shows polarization values at applied electrical fields ranging from −60 kV/cm to 60 kV/cm of three BMgT-BKT-BNT compositions indicated as O, P, and Q in Table 2. FIG. 10 shows electromechanical strain values at applied electrical fields ranging from −60 kV/cm to 60 kV/cm of a 50BMgT-25BKT-25BNT (composition Q). The results shown in FIGS. 9 and 10, indicate that large electromechanical strain values can be obtained for these compositions.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A lead-free piezoelectric ceramic material having the general chemical formula:

$$x\text{Bi}(A_{0.5}\text{Ti}_{0.5})O_3\text{-}z(\text{Bi}_{0.5}\text{Na}_{0.5})\text{TiO}_3, \text{ wherein } x+z=1;$$

and wherein A=Mg or Ni.

2. The ceramic material of claim 1, wherein said material comprises a solid solution having a stable perovskite structure at standard atmospheric conditions.

3. The lead-free piezoelectric ceramic material of claim 2, wherein 0.01≤x≤0.70.

4. The lead-free piezoelectric ceramic material of claim 1, having the general chemical formula wherein 0<x≤0.50.

5. The lead-free piezoelectric ceramic material of claim 1, wherein said ceramic material has a piezoelectric strain coefficient $d_{33}$ equal to or exceeding that of a lead zirconate titanate perovskite.

6. The lead-free piezoelectric ceramic material of claim 1, wherein said ceramic material has a maximum piezoelectric $d_{33}$ value in the range of about 200 pm/V to about 700 pm/V.

7. The lead-free piezoelectric ceramic material of claim 6, wherein said ceramic material has a maximum piezoelectric $d_{33}$ value in the range of about 300 pm/V to about 400 pm/V.

8. The lead-free piezoelectric ceramic material of claim 1, wherein said ceramic material has a maximum electromechanical strain value in the range of about 0.20 percent to about 0.35 percent.

9. The lead-free piezoelectric ceramic material of claim 1, wherein said ceramic material has fatigue resistance equal to or exceeding that of a lead zirconate titanate perovskite.

10. The lead-free piezoelectric ceramic material of claim 1 having a Curie temperature ($T_c$) in the range of about 100° C. to about 500° C.

11. The lead-free piezoelectric ceramic material of claim 10 wherein the $T_c$ is in the range of about 300° C. to about 400° C.

* * * * *